United States Patent [19]

Brewster

[11] Patent Number: 5,399,914
[45] Date of Patent: Mar. 21, 1995

[54] HIGH RATIO CURRENT SOURCE

[75] Inventor: Richard Brewster, West Boylston, Mass.

[73] Assignee: Allegro Microsystems, Inc., Worcester, Mass.

[21] Appl. No.: 138,662

[22] Filed: Oct. 18, 1993

[51] Int. Cl.$^6$ .......................... H03K 3/01; G05F 3/04; G05F 3/16; H03F 3/45
[52] U.S. Cl. .................. 327/538; 323/311; 323/315; 330/257; 327/108; 327/530
[58] Field of Search .............. 307/270, 253, 254, 289, 307/290, 291, 296.1, 296.6, 490; 323/312, 313, 315, 311; 330/257, 288

[56] References Cited

U.S. PATENT DOCUMENTS

| | | | |
|---|---|---|---|
| 4,085,411 | 4/1979 | Genesi | 354/51 |
| 4,268,759 | 5/1981 | Gilbert | 307/490 |
| 4,475,077 | 10/1984 | Nagano | 323/312 |
| 4,952,866 | 8/1990 | Van Tuijl | 323/312 |
| 5,164,658 | 11/1992 | Kuwahara | 323/315 |
| 5,175,489 | 12/1992 | Mizuide | 323/315 |

OTHER PUBLICATIONS

*Analog IC Design: The Current-Mode Approach*, edited by C. Toumazou, F. J. Lidgey, and D. G. Haigh, 1990, Peter Peregrinus Ltd. (ISBN 0 86341 2157), pp. 70–79.
*Analog IC Design: The Current-Mode Approach*, edited by C. Toumazou, F. J. Lidgey, and D. G. Haigh, 1990, Peter Peregrinus Ltd. (ISBN 0 86341 2157), pp. 280–283.
An Integratable Precision Voltage-to-Current Converter with Bilateral Capability, S. Pookaiyaudon and W. Surakampontorn, IEEE Journal of Solid-State Circuits, vol. SC 13, No. 3, Jun. 1978, pp. 411–412.

*Primary Examiner*—Timothy P. Callahan
*Assistant Examiner*—Trong Phan

[57] ABSTRACT

A current source circuit includes at least three pairs of bipolar transistors of the same polarity type. The first transistors of each pair are connected in one series circuit string emitter to collector. The second transistors of each pair are connected in another circuit string. The first-pair second transistor is connected emitter to collector with the second-pair second transistor while the emitter of the second-pair second transistor is connected to the base of the third-pair second transistor which serves as the output transistor. The first transistors of the first and third pairs have their bases connected respectively with their collector. The bases of the two second-pair transistors are cross coupled with the collectors of the second-pair transistors. With an input current applied to the collector of the first first-pair transistor the output current may be many times greater than the input current depending upon the relative base-emitter junction areas of the six transistors, and the high current ratio is relatively independent of the transistor current gains.

4 Claims, 1 Drawing Sheet

HIGH RATIO CURRENT SOURCE

BACKGROUND

This invention relates to a current source circuit having a high current mirror ratio, and more particularly to such a current source entirely composed of a translinear cross-quad circuit.

Several approaches have been used to obtain high-current-ratio current sources. One approach employs a standard basic current mirror circuit modified with feedback to augment the base current of the output transistor. Such a current mirror circuit is described in the patent to Robert Genesi, U.S. Pat. No. 4,085,411 issued Apr. 18, 1993 and assigned to the same assignee as is the present invention.

Another approach is the use of translinear circuits employing a number of bipolar devices, the PN-diode and base-emitter junctions of which are connected in a closed loop and the circuit current ratio is directly related to the product and quotient of the base-emitter junction areas. The circuit of FIG. 1 is an example of such a translinear current source.

The diodes Q1, Q2, Q3, Q4 and Q5 are seen to be in a closed loop that is completed by the base-emitter junction of transistor Q6. This leads to a current ratio $$\frac{I_{out}}{I_{in}} = \frac{A_3^2 A_4 A_5 A_6}{(A_3 + A_7) A_7^2 A_2 A_3}$$

wherein A2,A3,A4,A5,A6 and A7 are the PN-junction areas of the respective bipolar devices Q2,Q3,Q4,Q5,Q6 and Q7. If the areas of devices Q7 and Q2 have a relative value of 1, and areas of devices Q3, Q4, Q5 and Q6 are respectively 2, 4, 4 and 8, then the current gain $I_{out}/I_{in}$ is 85.3.

Current sources of the above mentioned type have a current ratio characteristic that is dependent upon the current gains of the transistors, making the manufacture of such current sources to a tight specification of current ratio difficult, and also leading to greater sensitivity of current ratio with ambient operating temperature.

It is an object of this invention to overcome the shortcomings of the current sources of the prior art and to provide a high ratio current source circuit capable of providing high output current and having a high current ratio that is relatively independent of transistor current gains.

SUMMARY OF THE INVENTION

A high ratio current source has one series circuit string wherein each a first, second and third bipolar transistors of one polarity type are connected in that order emitter-to-collector. Another series circuit string has a fourth and fifth transistors of the one type connected respectively emitter-to-collector, and a sixth transistor of the one type having a base connected to the emitter of the fifth transistor.

The emitters of the third and sixth transistors are connected together and to a circuit ground point and the collector of the fourth transistor is adapted for connection to a DC supply source. The bases of the second and fifth transistors are cross connected respectively to the collectors of the fifth and second transistors.

In one embodiment, the product of the base-emitter junction areas of the fourth, second and third transistors is preferably made substantially less than the product of the base-emitter areas of the first, fifth and sixth transistors to provide in the current source a high current ratio characteristic whereby the collector current of the sixth transistor is proportional to and substantially greater than a current introduced in the collector of the first transistor. Alternatively, if the first named product is greatest, the circuit gain will become a small fraction of unity.

Yet another pair of transistors of the one polarity type, a seventh and eighth transistor that are cross coupled as are the second and fifth transistors, may be added by breaking the emitter-to-collector connections between first and second transistors and between fourth and fifth transistors and inserting respectively the seventh and eight cross coupled transistors.

In the later case, it is preferred to make the product of the base-emitter junction areas of the first, eighth, second and third transistors substantially less than the product of the base-emitter areas of the fourth, seventh, fifth and sixth transistors for effecting in this current source circuit a high current ratio characteristic. Further addition of one or more similar pairs of cross coupled transistors will make it possible to achieve even higher current ratios.

This invention recognizes the possibility and advantages of substituting for pairs of bipolar devices in a conventional translinear current mirror circuit, one or more cross coupled pairs of bipolar transistors. The circuit provides a combination of current source characteristics including a high current ratio that is relatively insensitive to transistor beta values, can operate with low value supply voltages, and occupies a relatively small area of silicon in an integrated circuit.

DESCRIPTION OF THE PREFERRED EMBODIMENT

Figure 1:
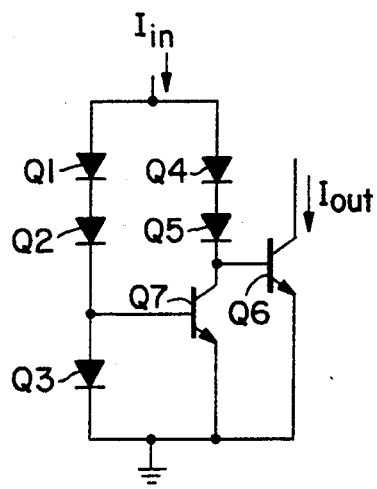
FIG. 1 shows a high ratio current source of the prior art.
Figure 2:
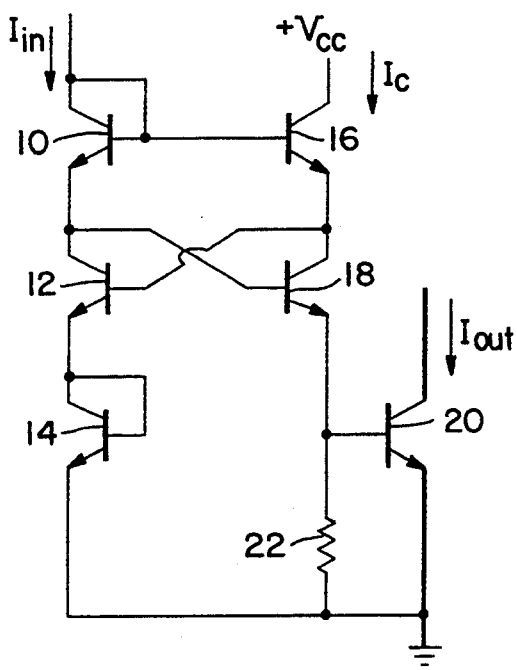
FIG. 2 shows a translinear cross-quad current source of this invention.

Referring to FIG. 2, the current source is made up essentially of six NPN transistors. A first series string of three transistors consists of diode-connected input transistor 10, a transistor 12 and a diode-connected transistor 14. A second series string of three transistors consists of transistors 16 and 18 and output transistor 20. The bases of transistors 10 and 16 are tied together. The bases of transistors 12 and 18 are connected respectively to the collectors of transistors 18 and 12. The resistor 22, connected across base and emitter of output transistor 20, may help to insure stability of the circuit against oscillations and is high enough to draw away only insignificant current from the base of transistor 20, but resistor 22 is not essential.

The positive DC supply voltage, $V_{cc}$, may be any voltage equal to or exceeding three base-emitter voltage ($V_{be}$) drops, e.g. 4.8 volts. The output current, $I_{out}$, in the collector of output transistor 20 is proportional to the input current, Iin, demonstrated as follows.

Beginning at the circuit ground point at the emitter of output transistor 20, and summing the voltage drops around the loop including the base-emitter junctions of all six transistors, gives $V_{be}(20) + V_{be}(18) + V_{be}(10) - V_{be}(16) - V_{be}(12) - V_{be}(14) = 0,$ where $V_{be}(20)$ is the base-emitter voltage of transistor 20, etc, and neglecting the relatively small base currents.

This equation can be rewritten as $$V_T \ln \frac{I_{out}}{I_o} + V_T \ln \frac{I_c}{I_o} + V_T \ln \frac{I_{in}}{I_o} - V_T \ln \frac{I_c}{I_o} - V_T \ln \frac{I_{in}}{I_o} - V_T \ln \frac{I_{in}}{I_o} = 0,$$

assuming the base-emitter junctions of all six transistors have the same area. In this special case $$V_T \ln \frac{I_{out} \cdot I_c \cdot I_{in}}{I_c \cdot I_{in} \cdot I_{in}} = 0,$$

$$\frac{I_{out} \cdot I_c \cdot I_{in}}{I_c \cdot I_{in} \cdot I_{in}} = 1, \text{ and}$$

$$\frac{I_{out}}{I_{in}} = 1.$$

In the foregoing example, therefore, with all transistors having the same base-emitter areas, the current gain is unity. However, in the situation wherein the base-emitter areas of transistors 16, 12 and 14 are each the minimum area for the integrated circuit process to be used, and transistors 20, 18 and 10 have base-emitter areas larger than that minimum area, the current ratio $I_{out}/I_{in}$ will be greater than unity. For example, for a minimum area of 1, and for the relative areas of transistors 20, 18 and 10 being respectively 8, 4 and 4, the loop equation is $$V_T \ln \frac{I_{cout}}{8I_o} + V_T \ln \frac{I_c}{4I_o} + V_T \ln \frac{I_{in}}{4I_o} - V_T \ln \frac{I_c}{I_o} - V_T \ln \frac{I_{in}}{I_o} - V_T \ln \frac{I_{in}}{I_o} = 0,$$

leading to $$V_T \ln \frac{I_{out}/8 \cdot I_c/4 \cdot I_{in}/4}{I_c \cdot I_{in} \cdot I_{in}} = 0$$

$$\frac{I_{out} \cdot I_c \cdot I_{in}}{128 \, I_c \cdot I_{in} \cdot I_{in}} = 1$$

$$\frac{I_{out}}{I_{in}} = 128.$$

Thus the current gain in this case is 128.

The use of the translinear cell composed of the cross coupled transistors 12 and 18 in the current source circuit of FIG. 2, greatly reduces the sensitivity of circuit current gain $I_{out}/I_{in}$ to transistor beta, i.e. transistor current gain, and the especially large base-emitter junction area of the output transistor 20, which is included in the closed loop of this translinear circuit and simultaneously helps to make the current ratio of the current source circuit high, while providing a high output current capability of output transistor 20.

This basic current source circuit may be modified by including one or more additional pairs of cross coupled bipolar transistors. The circuit of FIG. 3 is such a modification wherein cross coupled transistors 26 and 28 have been added for further increasing the overall current ratio of the current source circuit.

Figure 3:
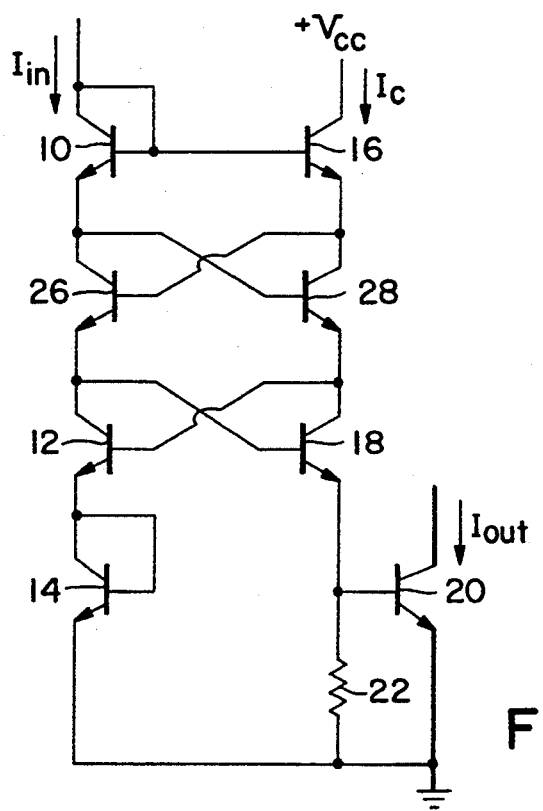
FIG. 3 shows a modification of FIG. 2.

The circuits of FIGS. 2 and 3 realize a low sensitivity in current ratio as a function of variations in transistor gains that are a function of the current in the base emitter junctions of the cross coupled transistor pairs. This is true because for example a current of the same magnitude flows through the base-emitter junctions of transistors 26 and 28, and the same current flows through the base-emitter junctions of transistors 12 and 18, and the base emitter junction voltage $v_{be}$ of one of these transistors appears algebraically positive in the loop equation given above for the circuit of FIG. 2 while the $v_{be}$ of the other transistor appears negative in that loop equation. Thus changes in transistor beta due to changes in temperature or current cancel. Also, there is no significant change in sensitivity of current ratio by the addition of one, two or more cross coupled transistor pairs that increase the ratio itself.

It is also possible to use these current source circuits in a different manner. For example, a varying current $I_v$ (not shown) is introduced into the base of transistor 14, then the output current $I_{out}$, in the case of FIG. 2, will be $128(I_{in} + I_v)$.

Another variation possible in these current source circuits, for example with respect to FIG. 2, is to make the product of the areas of transistors 20, 18 and 10 much less rather than much more than the product of the areas of transistors 14, 12 and 16, in which case a high ratio of current reduction is achieved.

In the circuit of FIG. 3, the loop follows the base emitter junctions of transistors in the order 12, 18, 26, 16, 10, 28, 12 and 14 so that the areas of transistors 10, 28, 12 and 14 are to have the minimum value of 1 and transistors 16, 26, 18 and 20 are in this example made 2, 4, 4 and 8. By a similar analysis given above for the circuit of FIG. 2, the circuit gain in the example of FIG. 3 is 256.

I claim:

1. A high ratio current source comprising:
   a) a DC voltage supply conductor and a circuit ground point;
   b) one series circuit string comprised of a first(10), second(12) and third(14) bipolar transistors of one polarity type, said first, second and third bipolar transistors each having a base, an emitter and a collector; said first(10) transistor base and collector connected together, said third(14) transistor base and collector connected together, said first(10) transistor emitter connected to said collector of said second(12) transistor and said second (12) transistor emitter connected to said collector of said third(14) transistor; and
   c) another circuit string comprised of a fourth(16), fifth(18) and sixth(20) bipolar transistors of said one polarity type, said fourth, fifth and sixth bipolar transistors each having a base, emitter and collector, said base of said fourth transistor connected to said first transistor base, said fourth transistor emitter connected to said collector of said fifth transistor and said fifth transistor emitter connected to said base of said sixth transistor; said emitters of said third and sixth transistors being connected together and to said circuit ground point, said collector of said fourth transistor connected to said DC voltage supply conductor, said bases of said second and fifth transistors being connected respectively to said collectors of said fifth and second transistors.

2. The current source of claim 1 wherein the small product of the base-emitter junction areas of said fourth, second and third transistors is substantially less than the large product of the base-emitter areas of said first, fifth and sixth transistors, so that when an input current is introduced in said collector of said first transistor an output current in said collector of said sixth transistor is greater than the input current to said small product.

3. The current source of claim 1 additionally comprising a) a seventh(26) bipolar transistor of said one polarity type having a collector connected to said emitter of said first(10) transistor and having an emitter connected to said collector of said second transistor serving as said connection between said first(10) transistor emitter and said second(12) transistor collector; and b) an eighth(28) bipolar transistor of said one polarity type having a collector connected to said emitter of said fourth transistor and having an emitter connected to said collector of said fifth transistor serving as said connection between said fourth transistor emitter and said fifth transistor collector, the bases of said seventh(26) and eighth transistors being connected respectively to said collectors of said eight(28) and seventh(26) transistors.

4. The current source of claim 3 wherein the product of the base-emitter junction areas of said first(10), eighth(28), second(12) and third(14) transistors is substantially less than the product of the base-emitter areas of said fourth(16), seventh(26), fifth(18) and sixth(20) transistors.

* * * * *